(12) United States Patent
England et al.

(10) Patent No.: US 9,466,659 B2
(45) Date of Patent: Oct. 11, 2016

(54) FABRICATION OF MULTILAYER CIRCUIT ELEMENTS

(71) Applicant: GLOBALFOUNDRIES Inc., Grand Cayman (KY)

(72) Inventors: Luke England, Saratoga Springs, NY (US); Mahesh Anant Bhatkar, Singapore (SG); Wanbing Yi, Singapore (SG); Juan Boon Tan, Singapore (SG)

(73) Assignee: GLOBALFOUNDRIES INC., Grand Cayman (KY)

( * ) Notice: Subject to any disclaimer, the term of this patent is extended or adjusted under 35 U.S.C. 154(b) by 201 days.

(21) Appl. No.: 14/326,659

(22) Filed: Jul. 9, 2014

(65) Prior Publication Data

US 2016/0013262 A1 Jan. 14, 2016

(51) Int. Cl.
*H01L 21/4763* (2006.01)
*H01L 49/02* (2006.01)
*H01L 21/033* (2006.01)
(Continued)

(52) U.S. Cl.
CPC ........... *H01L 28/10* (2013.01); *H01L 21/0335* (2013.01); *H01L 21/2885* (2013.01); *H01L 21/31127* (2013.01); *H01L 21/31144* (2013.01); *H01L 21/324* (2013.01); *H01L 21/3212* (2013.01); *H01L 21/3213* (2013.01); *H01L 21/78* (2013.01); *H01L 23/49822* (2013.01); *H01L 23/5227* (2013.01)

(58) Field of Classification Search
CPC ................... H01L 21/3212; H01L 21/76877; H01L 21/7684

USPC ....... 438/618–626, 3; 257/E21.303, E21.299
See application file for complete search history.

(56) References Cited

U.S. PATENT DOCUMENTS 4,349,609 A * 9/1982 Takeda ................ H01L 23/5329
216/22
6,153,525 A * 11/2000 Hendricks ......... H01L 21/31053
257/E21.244
(Continued)

OTHER PUBLICATIONS

B. Guruprasad et al., "Inductors from Wafer-Level Package Process for High Performance RF Applications", 2009 11th Electronics Packaging Technology Conference, pp. 899-902.
(Continued)

*Primary Examiner* — Julia Slutsker
(74) *Attorney, Agent, or Firm* — Heslin Rothenberg Farley and Mesiti PC; Nicholas Mesiti

(57) ABSTRACT

Wafer-level methods of forming circuit elements, such as multilayer inductors or transformers, are provided. The methods include, for instance: forming, in at least one layer above a substrate, at least one conductive portion of the circuit element; providing an uncured polymer-dielectric material surrounding, at least in part, and overlying the conductive portion(s) of the element; partially curing the polymer-dielectric material to obtain a partially-hardened, polymer-dielectric material; and polishing the partially-hardened, polymer-dielectric material down to the conductive portion(s). The polishing planarizes the partially-hardened, polymer-dielectric material and exposes an upper surface of the conductive portion(s) to facilitate forming at least one other conductive portion of the element above and in electrical contact with the conductive portion(s). After polishing, curing of the polymer-dielectric material is completed. In one embodiment, the conductive portion(s) and the other conductive portion(s) define, at least in part, a conductive coil(s) of the element.

20 Claims, 10 Drawing Sheets

(51) Int. Cl.
*H01L 21/288* (2006.01)
*H01L 21/311* (2006.01)
*H01L 21/321* (2006.01)
*H01L 21/3213* (2006.01)
*H01L 21/324* (2006.01)
*H01L 21/78* (2006.01)
*H01L 23/498* (2006.01)
*H01L 23/522* (2006.01)

(56) References Cited

U.S. PATENT DOCUMENTS

| | | | |
|---|---|---|---|
| 7,799,602 B2* | 9/2010 | Pagaila | H01L 21/565 257/E21.007 |
| 8,097,490 B1* | 1/2012 | Pagaila | H01L 21/561 257/E21.007 |
| 2002/0151164 A1* | 10/2002 | Jiang | H01L 24/03 438/613 |
| 2011/0127668 A1* | 6/2011 | Lin | H01L 23/49827 257/737 |

OTHER PUBLICATIONS

B. Xinhai et al., "Simulation and Modeling of Wafer Level Silicon-Base Spiral Inductor", 2012 International Conference on Electronic Packaging Technology & High Density Packaging, pp. 29-31.

Z. Ahmad, "Polymeric Dielectric Materials", INTECH (Open Science/Open Minds), Oct. 3, 2012, 24 pages.

* cited by examiner

FABRICATION OF MULTILAYER CIRCUIT ELEMENTS

FIELD OF THE INVENTION

The present invention relates to methods of fabricating circuit elements, and in particular, to wafer-level methods for bulk-fabrication of circuit elements, such as multilayer inductors or multilayer transformers.

BACKGROUND OF THE INVENTION

In recent years, the features of modern, ultra-high density integrated circuits have steadily decreased in size in an effort to enhance overall speed, performance, and functionality of circuits. As a result, the semiconductor industry continues to experience tremendous growth due to significant and ongoing improvements in integration density of a variety of electronic components, such as transistors, capacitors, diodes, and the like. These improvements have primarily come about due to a persistent and successful effort to reduce the critical dimension (i.e., minimum feature size) of components, directly resulting in the ability of process designers to integrate more and more components into a given area of a semiconductor chip.

Improvements in integrated circuit design have been essentially two-dimensional (2D); that is, improvements have been related primarily to the layout of the circuit on the surface of a semiconductor chip. However, as device features are continuing to be aggressively scaled, and more semiconductor components are being placed onto the surface of a single chip, the required number of electrical interconnects necessary for circuit functionality dramatically increases, resulting in an overall circuit layout that is increasingly becoming more complex and densely packed. Furthermore, even though improvements in photolithography processes have yielded significant increases in integration densities of 2D circuit designs, simple reduction in feature size is rapidly approaching limits of what can presently be achieved in only two dimensions.

As the number of electronic devices on single chips rapidly increases, three-dimensional (3-D) integrated circuit layouts, such as stacked chip designs, are being considered for certain semiconductor devices or circuits, in part to overcome the feature size and density limitations associated with 2-D layouts. In one three-dimensional integrated design, two or more semiconductor dies may be bonded together, and electrical connections formed between the dies.

Circuit elements, such as capacitors, inductors, transformers, etc., are widely used in various electronic circuits. Typically, an inductor or transformer is a discrete device, separately manufactured and integrated into an electronic circuit via coupling to, for instance, a motherboard of the electronic circuit. Existing designs of such circuit elements may not lend themselves to easy integration into three-dimensional circuit layouts.

BRIEF SUMMARY

The shortcomings of the prior art are overcome, and additional advantages are provided, through the provision, in one aspect, of method of forming a circuit element above a substrate. The forming includes: forming, in at least one layer above the substrate, at least one conductive portion of the circuit element; providing an uncured polymer-dielectric material surrounding, at least in part, and overlying the at least one conductive portion of the circuit element; partially curing the polymer-dielectric material to obtain a partially-cured, polymer-dielectric material; polishing the partially-cured, polymer-dielectric material down to the at least one conductive portion of the circuit element; and forming at least one other conductive portion of the circuit element above and in electrical contact with the at least one conductive portion of the circuit element.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Also note that reference is made below to the drawings, which are not drawn to scale for ease of understanding, wherein the same reference numbers used throughout different figures designate the same or similar components.

Disclosed hereinbelow are wafer-level batch processes which may be employed to fabricate a large number of discrete circuit elements, such as inductive circuit elements, including inductors or transformers. Note that, as used herein, "wafer-level" refers to fabrication of a plurality of circuit elements across a substrate, such as across an upper surface of a semiconductor wafer or other wafer used in the fabrication of integrated circuits. Alternatively, wafer-level could refer to a panel used, for instance, in the solar industry during fabrication of an array of solar cells. Other applications of the fabrication processes disclosed herein will be apparent to those skilled in the art. Note also, a desired component form factor may be met, such as a JEDEC Quad Flat No-lead (QFN) footprint for surface mount compatibility to facilitate integration of the circuit element(s) die into any of a variety of 2-D and 3-D packages.

Figure 1A:
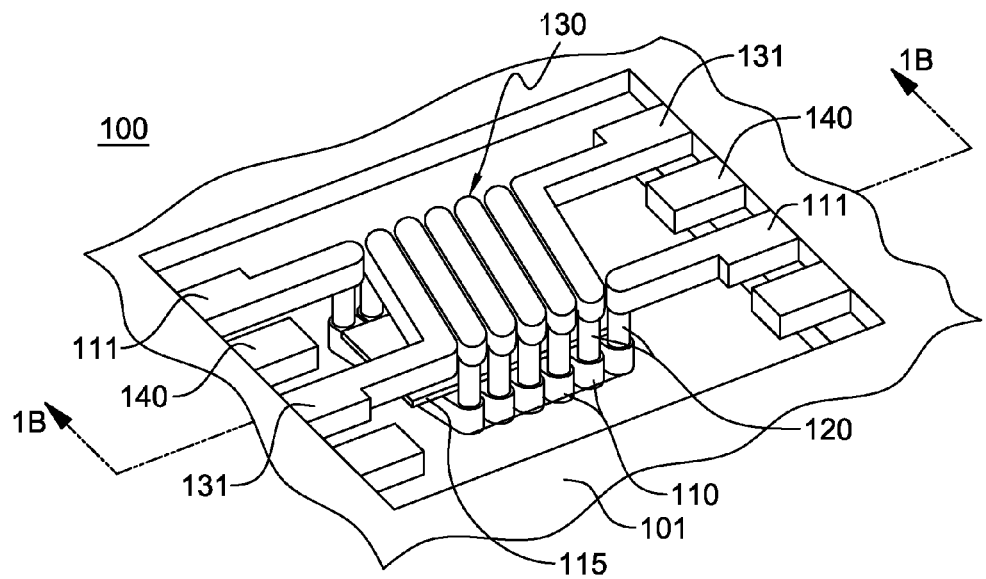
FIG. 1A depicts one embodiment of a multilayer circuit element formed by a fabrication process, in accordance with one or more aspects of the present invention.
Figure 1B:
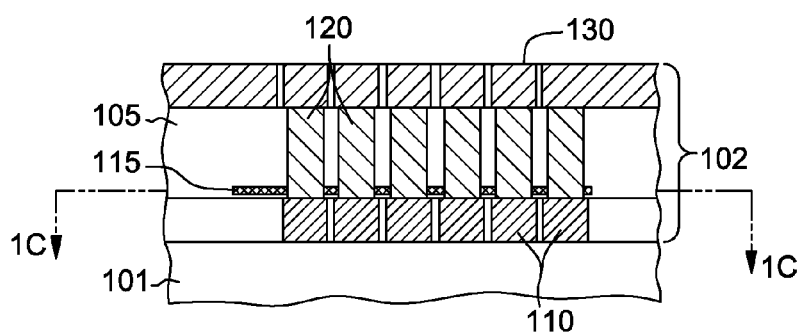
FIG. 1B is a cross-sectional elevational view of the multilayer circuit element of FIG. 1A, taken along line 1B-1B thereof, in accordance with one or more aspects of the present invention.
Figure 1C:
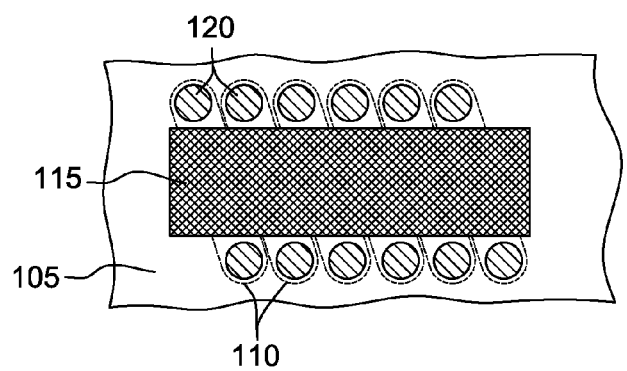
FIG. 1C is a cross-sectional plan view of the multilayer circuit element of FIG. 1B, taken along line 1C-1C thereof, in accordance with one or more aspects of the present invention.

FIGS. 1A-1C depict one embodiment of a circuit element, generally denoted 100, to be fabricated in accordance with the processes disclosed herein.

Referring collectively to FIGS. 1A-C, circuit element 100 includes, or is disposed above, a substrate 101, such as a semiconductor substrate or other wafer substrate, and includes, in the depicted embodiment, a lower conductive portion 110, a conductive vias portion 120, and an upper conductive portion 130 contacting and electrically connected as illustrated to form a multilayer structure 102 disposed above substrate 101. A dielectric material, such as a polymer-dielectric 105 surrounds the lower conductive portion 110, conductive vias portion 120, and upper conductive portion 130 of circuit element 100. In the depicted configuration, circuit element 100 illustrates one embodiment of a transformer, and a thin magnetic material layer 115 is provided disposed within a region defined, in part, by the conductive vias portion 120 of circuit element 100.

Note that in the illustrated transformer configuration, two coils are defined in multilayer structure 102, within which magnetic material layer 115 at least partially resides. In particular, lower conductive portion 110 is shown to include a first plurality of parallel conductors oriented in a first direction, and upper conductive portion 130 includes a second plurality of parallel conductors oriented in a second direction, offset from the first direction. Conductive contacts 111, 131, formed (for instance) contemporaneous with forming of upper conductive portion 130, electrically connect (in the illustrated example) to different conductive vias 120 near opposite ends of the structure. These conductive vias are in electrical contact with respective, different conductors of the lower conductive portion 110.

As one specific example, substrate 101 may have a thickness of about 500-600 microns, and multilayer structure 102 may have a thickness, in one example, of about 70 microns, of which lower conductive portion 110 may be about 20 microns thick, conductive vias portion 120 may be about 30 microns thick, and upper conductive portion 130 may be about 20 microns thick. In one instance, magnetic material layer 115 may be about 2 microns thick. Note that these thickness numbers are provided by way of example only. Further, note that in one embodiment, substrate 101 may be a semiconductor substrate, such as a silicon substrate or silicon containing substrate, and that the conductive portions of circuit element 100 may be fabricated of a metal or metal alloy, for instance, copper, which may be deposited using any suitable process, such as, electroplating.

Note that circuit element 100 of FIGS. 1A-1C is presented herein by way of example only, and that other circuit elements, and in particular, other inductive circuit elements, such as other inductor or transformer elements, may be fabricated using the processing disclosed herein. In one embodiment, a single coil inductive circuit element may be formed in a multilayer structure, or multiple coils may be formed, such as illustrated in the embodiment of FIGS. 1A-1C.

Figure 2A:
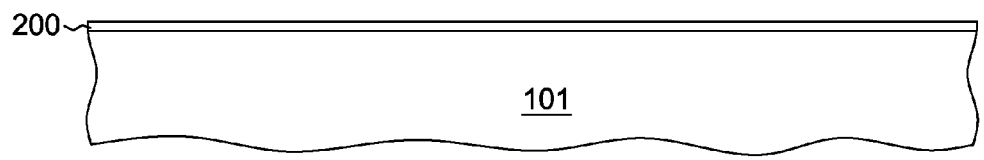
FIGS. 2A-2W depict one embodiment of a process for wafer-level fabrication of a plurality of multilayer circuit elements, in accordance with one or more aspects of the present invention.
Figure 2B:
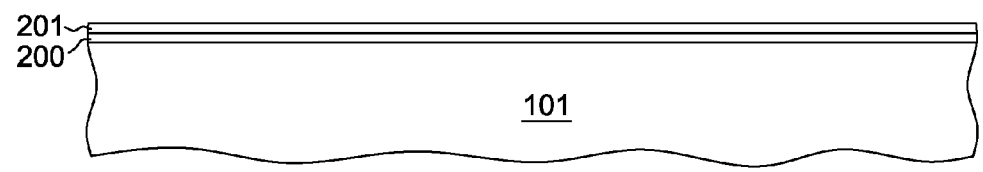
Figure 2C:
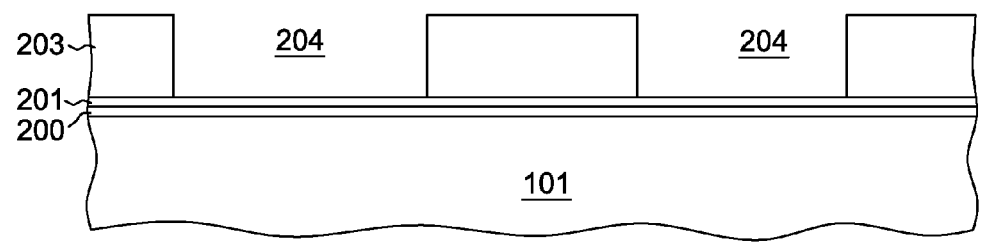
Figure 2D:
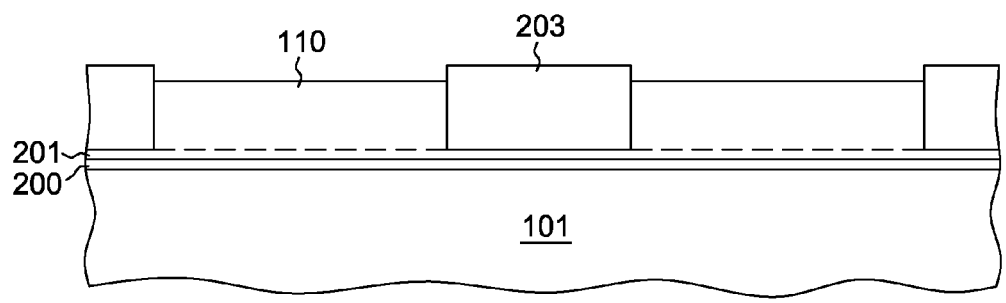
Figure 2E:
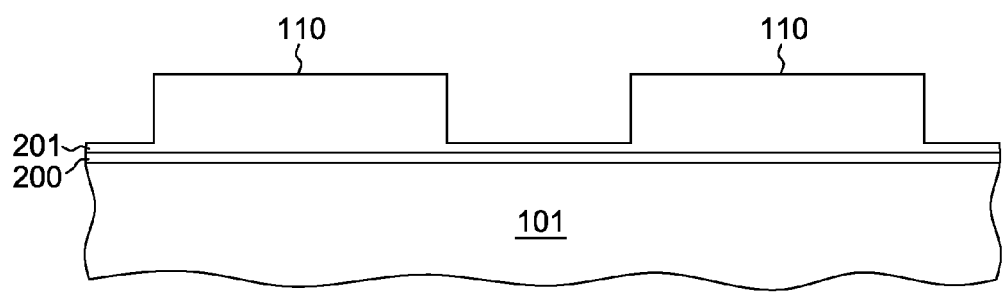
Figure 2F:
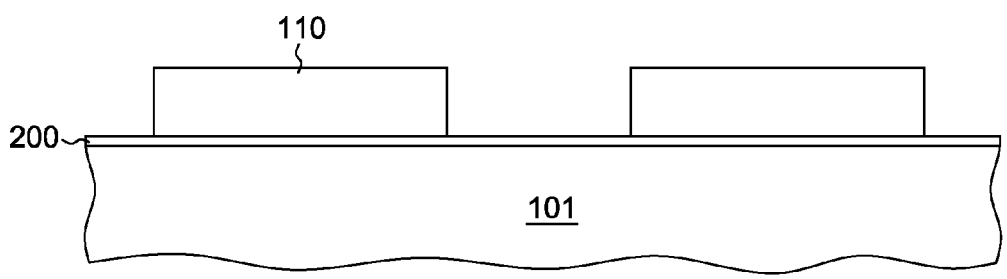
Figure 2G:
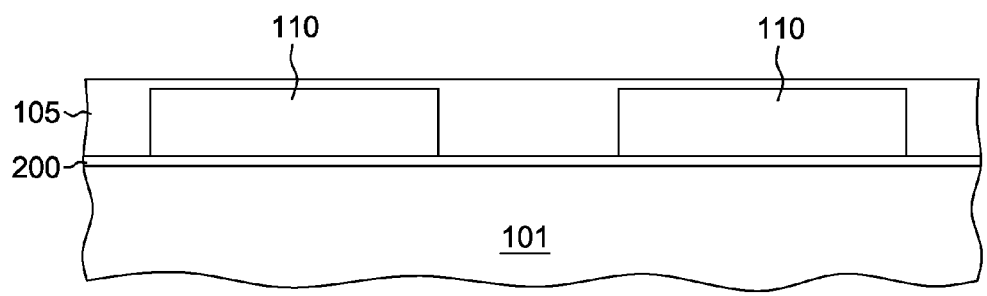
Figure 2H:
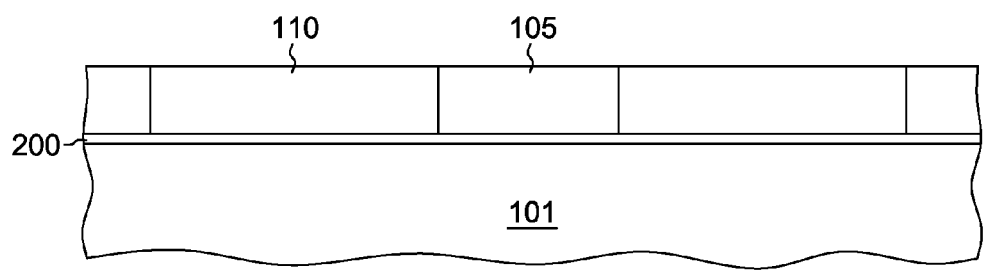
Figure 2I:
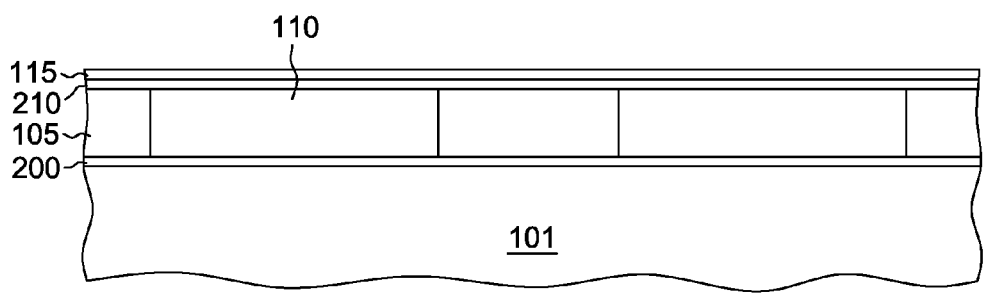
Figure 2J:
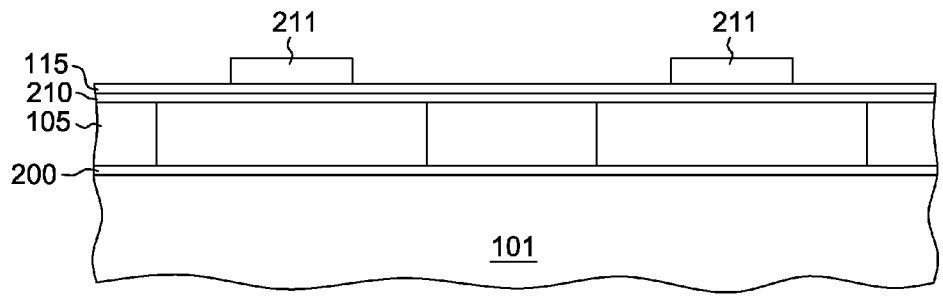
Figure 2K:
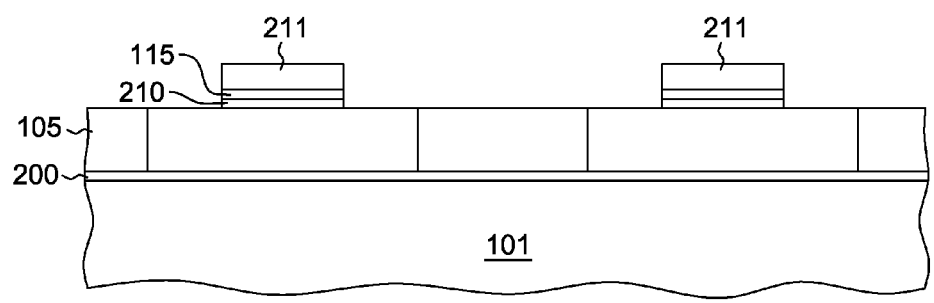
Figure 2L:
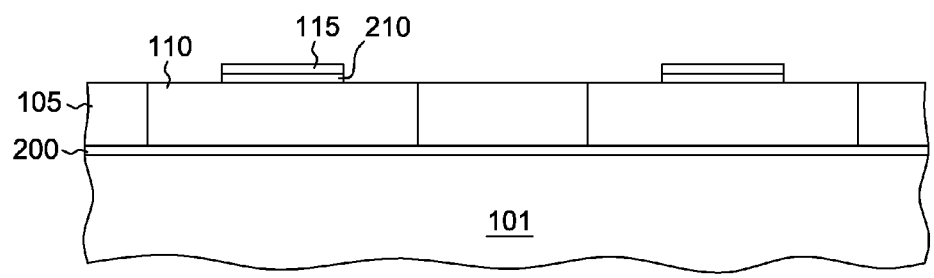
Figure 2M:
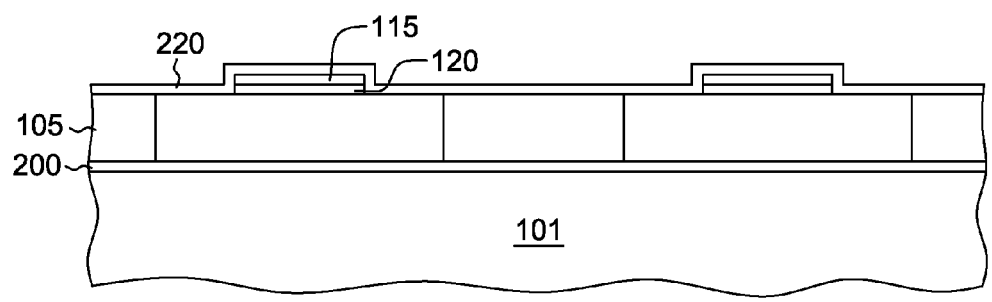
Figure 2N:
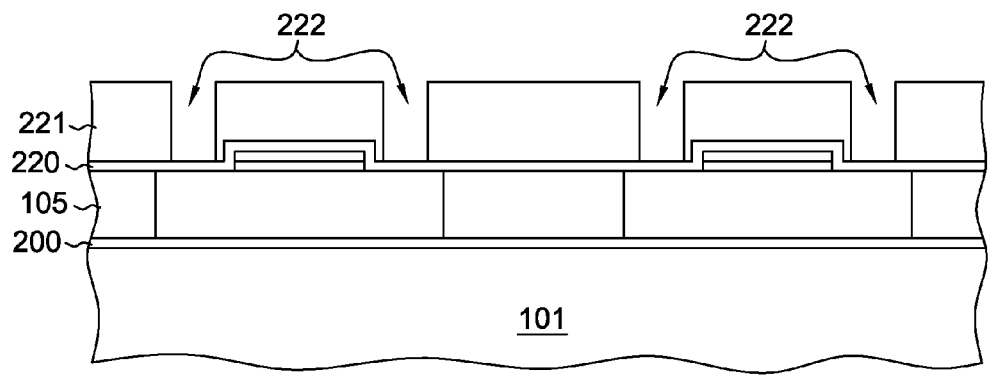
Figure 2O:
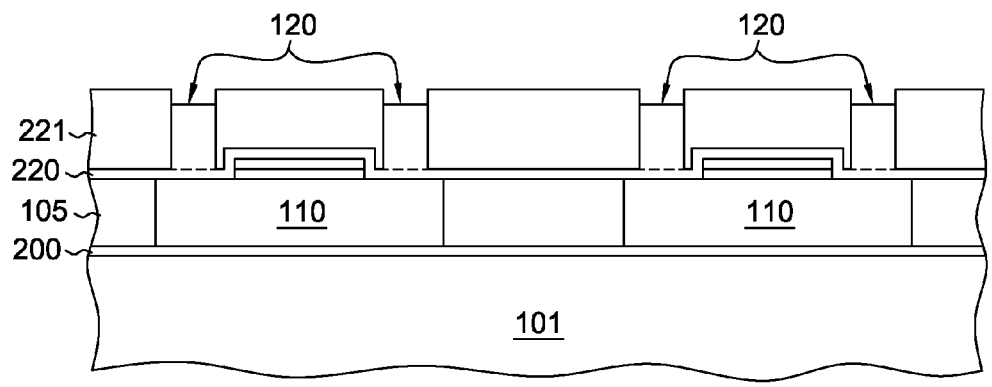
Figure 2P:
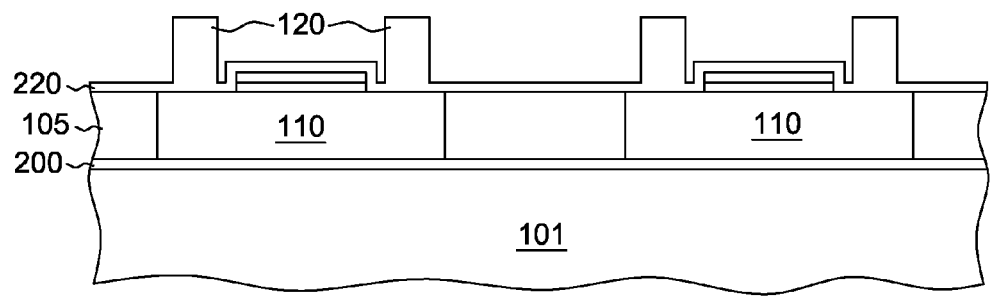
Figure 2Q:
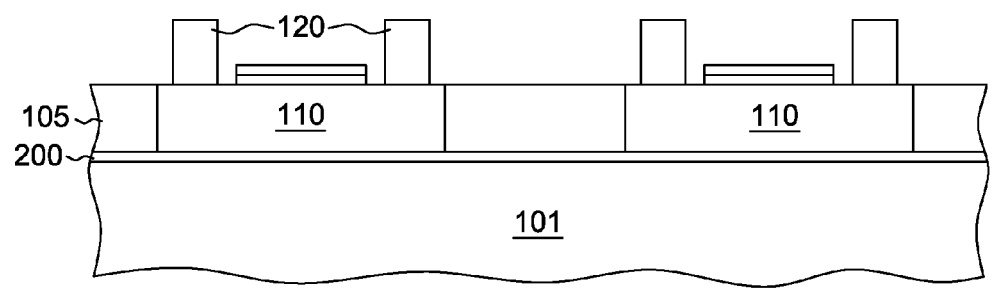
Figure 2R:
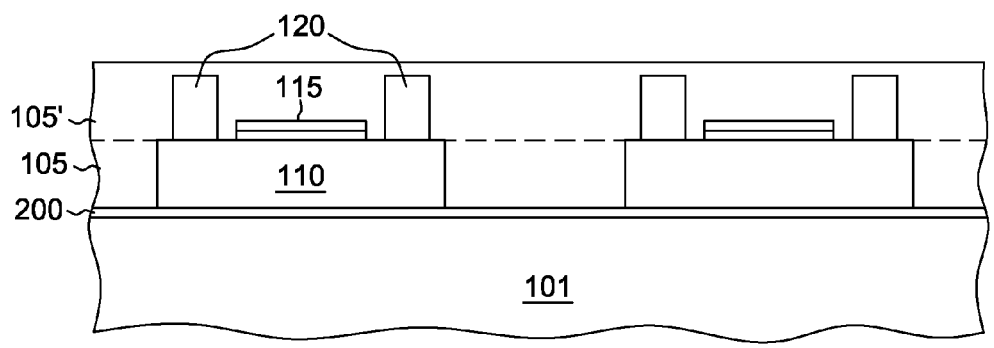
Figure 2S:
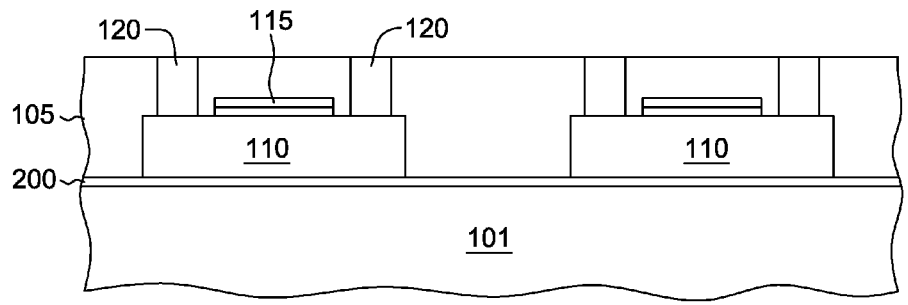
Figure 2T:
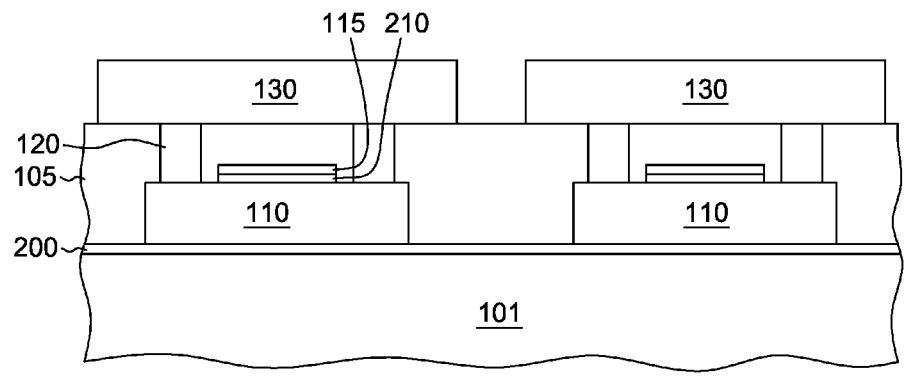
Figure 2U:
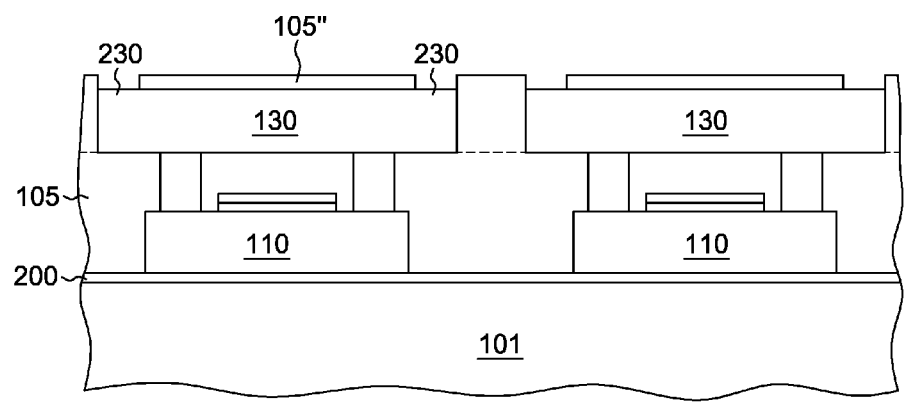
Figure 2V:
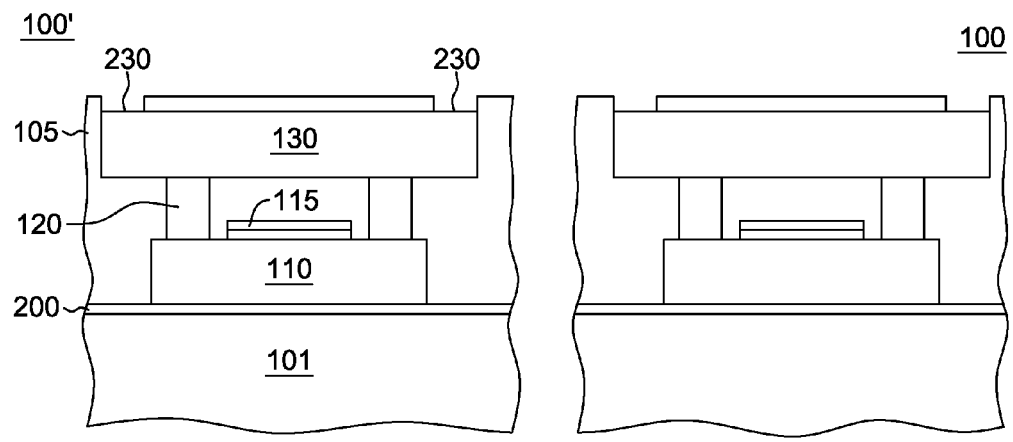
Figure 2W:
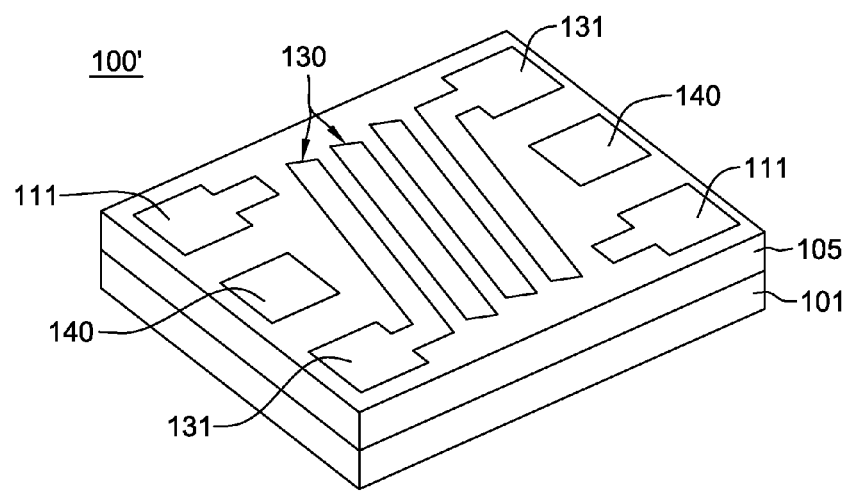

By way of further explanation, FIGS. 2A-2W depict one embodiment of a circuit element fabrication process, in accordance with one or more aspects of the present invention. Note that in these figures, an end elevational depiction of the circuit element(s) being fabricated is presented, which would be comparable to rotating 90° from the cross-sectional elevational view depicted by way of example in FIG. 1B.

Referring to FIG. 2A, a structure is illustrated which includes a substrate 101 over which a thin dielectric material layer 200 has been deposited. Substrate 101 may be any appropriate carrier material, above which circuit elements may be formed, as described herein. Note that a plurality of active and/or passive circuit elements, such as transistors, capacitors, resistors, inductors, and the like, may be formed over or integrated within substrate 101, in which case, substrate 101 may include a device layer of an integrated circuit. Depending on overall design strategy, substrate 101 may be a semiconductor wafer, such as a bulk silicon wafer, wherein as in other embodiments, substrate 101 may include or be formed as a single crystalline silicon, polycrystalline silicon, amorphous silicon, silicon-on-nothing (SON), silicon-on-insulator (SOI), or silicon-on-replacement-insulator (SRI) architecture or the like, as will be understood by those skilled in the art. The substrate may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb) or combinations thereof or an alloy semiconductor including GaAsP, AlInAs, GaInAs, GaInP, or GaInAsP or combinations thereof. In other implementations, substrate 101 might include or be fabricated of other materials, such as a glass or ceramic material, depending on the desired structure being fabricated. In one specific embodiment, substrate 101 might have a thickness of about 500-700 microns.

Thin dielectric material layer 200 may be deposited from a gaseous phase, using any suitable conventional deposition process, for instance, chemical-vapor deposition (CVD), physical vapor deposition (PVD), atomic layer deposition (ALD), or from a liquid phase, using a spin-on deposition process. In one example, dielectric material layer 200 may include or be fabricated of, for instance, silicon oxide ($SiO_2$), silicon nitride (SiN) or ($Si_3N_4$), etc. As one specific example, dielectric material layer may have a thickness of about 1 micron, and is provided, at least in part, to electrically isolate the multilayer circuit element(s) to be fabricated from substrate 101.

In FIG. 2B, an electroplating seed layer(s) 201 has been deposited over the structure using, for instance, physical vapor deposition (PVD) processing. In one example, electroplating seed layer(s) 201 may include a titanium or titanium-tungsten (TiW) adhesion material or a layer, and a copper seed material or layer, to facilitate current delivery during a subsequent electroplating process used in the fabrication process. By way of example, electroplating seed layer(s) 201 may have a thickness of about 1-2 microns.

As shown in FIG. 2C, a patterned resist mask layer 203 is formed with one or more openings 204 therein, within which lower conductive portions of the circuit elements are to be electroplated. Patterned resist mask layer 203 may be or include a layer of a light-sensitive material, such as, for example, a photoresist material. The thickness of this material may vary, depending on the application, and in one embodiment, the thickness of patterned resist mask layer 203 is selected to be greater than the desired height of the lower conductive portions of the circuit elements to be formed by electroplating above electroplating seed layer(s) 201 exposed within openings 204. For instance, if the desired thickness of lower conductive portions to be formed is about 20 microns, then the thickness of patterned resist mask layer 203 might be about 25-30 microns. The resist material may be spin-coated onto the structure, and patterned using conventional lithographic patterning and etch processing to remove portions of the resist material layer in any desired pattern to facilitate forming the lower conductive portions of the circuit elements.

As noted with respect to FIGS. 1A-1C, the lower conductive portions may include a plurality of parallel conductive channels. Therefore, the patterned resist mask layer 203 may be patterned with a plurality of parallel-extending openings or channels which expose the desired, respective portions of the underlying electroplating seed layer(s) 201.

As illustrated in FIG. 2D, the lower conductive portions 110 are electroplated within the resist openings or channels defined by patterned resist mask layer 203. By way of example, the lower conductive portions 110 may be an electroplated copper and/or copper alloy, and if desired, may be exposed to a heat treatment process after being formed, so as to facilitate grain growth and stabilization of the copper film characteristics. Note that the electroplating process is discontinued with the electroplated copper or copper alloy forming the lower conductive portions 110 disposed below the upper surface of the patterned resist mask layer 203. Thus, as noted, the thickness of the patterned resist mask layer 203 is chosen, in one embodiment, with reference to the desired thickness of the lower conductive portions 110. As one example, the thickness of lower conductive portions 110 may be about 20 microns, and the lower conductive portions may each be formed with a plurality of parallel conductive channels to, for instance, facilitate forming a circuit element such as depicted in FIGS. 1A-1C.

A wet or dry resist strip process is employed to remove the patterned resist mask layer, leaving the structure illustrated in FIG. 2E, after which seed layer etching may be performed to remove electroplating seed layer(s) 201, leaving the lower conductive portions 110 or conductive channel(s) of the circuit element disposed above substrate 101, as illustrated in FIG. 2F. Note that seed layer removal may be a wet etch process to remove the copper seed layer, and either a wet or dry etch of the adhesion layer, depending upon whether titanium (Ti) or titanium-tungsten (TiW) is used.

FIG. 2G depicts the structure of FIG. 2F after provision of a dielectric material, such as a polymer-dielectric material 105, surrounding and overlying, at least in part, the lower conductive portions 110 of the circuit elements. Note that the polymer-dielectric material used herein may be any polymer-dielectric, such as, for example, a polyimide resin, an epoxy resin, a polyacrylate resin, a phenol resin, a polyamide resin, a PBO or benzocyclobutene (BCB). As one specific example, polymer-dielectric material 105 could be the CA-60001B polymer-dielectric material offered by Hitachi Corp., of Tokyo, Japan. The structure is coated with polymer-dielectric material 105, and then soft-baked using, for instance, a low-temperature anneal, to partially cure or partially harden the polymer-dielectric material. As one specific example, this soft bake process might involve exposing the structure with the polymer-dielectric material to a temperature of approximately 100° C.-110° C. for about 3 minutes. At this stage, the upper surface of the polymer-dielectric material 105 may be non-planar, for instance, include slight waves across the surface. The thickness of the polymer-dielectric material is relatively thick, being sufficient to cover lower conductive portions 110.

Referring to FIG. 2H, a polishing process, such as a chemical-mechanical polishing process, is employed to planarize the partially-hardened, polymer-dielectric material 105. This planarization process may also planarize the upper surfaces of the lower conductive portions 110. For instance, in one embodiment, the polishing may planarize the upper surfaces of the copper conductors of the lower conductive portions. In one implementation, the chemical-mechanical polishing of the structure may be performed using a standard copper slurry. After polishing, a final curing or heat treatment of the polymer-dielectric material is performed in order to harden the material for downstream processing. As one specific example, the final curing process might involve exposing the structure with the partially-hardened, polymer-dielectric material to a temperature of approximately 375° C. for about 4 hours. A plasma-cleaning may be used if desired to remove any off-gassing residue from the copper surfaces. Note that the above-noted soft bake and final cure temperatures and durations are given by way of example only, and that variations on these examples are possible without departing from the scope of the present invention.

As shown in FIG. 2I, a dielectric material layer 210 may be disposed over the structure, and a magnetic material layer 115 sputtered over dielectric material layer 210. By way of example, standard deposition processes may be employed to deposit dielectric material layer 210 to a desired thickness, such as about 1 micron (in one example), after which, magnetic material layer 115 may be sputtered to a thickness of about 2 microns, again, by way of example only. In one implementation, dielectric material layer 210 may be a silicon-oxide ($SiO_x$) or silicon nitride (SiN) material layer, and magnetic material layer 115 is, for instance, a nickel-based material such as NiFe, CoNiFeB, CoNbZr. Alternatively, the magnetic material layer may be formed of CoTaZr and be deposited using physical vapor deposition (PVD) or electroless plating, depending on the particular magnetic material employed. Next, patterned resist masks 211 are established using conventional resist deposition and patterning techniques. The patterned resist masks 211 are configured and positioned where desired to retain magnetic material layer 115 for inclusion in the resultant circuit elements being fabricated.

As shown in FIG. 2K, magnetic material layer 115 and dielectric material layer 210 are etched outside of patterned resist masks 211. This may be accomplished, in one embodiment, via a timed, wet-etch of magnetic material layer 115 and dielectric material layer 210. After etching, the patterned resist masks 211 are removed via, for instance, a conventional wet or dry resist strip process, leaving the structure of FIG. 2L.

Referring to FIG. 2M, an electroplating seed layer 220 is deposited over the structure. The seed layer may be deposited using, for instance, physical vapor deposition (PVD) processing, and may include a titanium or titanium-tungsten adhesion material or layer, and a copper seed material or layer, for current delivery during the electroplating process. As part of this process, note that sidewall coverage of the magnetic material layer 115 is not essential since the conductive vias portions of the circuit elements to be plated are offset from the magnetic material layers 115.

As shown in FIG. 2N, a patterned resist mask layer 221 is formed with via openings 222 in the desired locations over the lower conductive portions 110 of the circuit elements in order to facilitate formation of the conductive via portions of the circuit elements in electrical contact with the lower conductive portions. The above-described resist coating and patterning process may be employed, with a thick coat of resist material being spun-coated over the structure, and then patterned with the desired via opening connection features. Note that the thickness of the patterned resist mask layer 221 is chosen with reference to the desired height of the conductive vias to be electroplated within via openings 222, that is, the thickness of pattern resist mask layer 221 is, in one embodiment, greater than the desired height of the conductive vias to be formed within via openings 222.

As shown in FIG. 2O, an electroplating processing is employed to provide conductive vias 120 within the via openings of the patterned resist mask layer 221. In one implementation, the conductive vias portions 120 may be formed as copper pillars plated to the desired height for the particular circuit element configuration being fabricated. Note again that the height of conductive vias 120 may be below an upper surface of patterned resist mask layer 221 in the process stage of FIG. 2O.

After formation of the conductive vias portions 120, the resist mask layer is stripped via wet or dry resist etching to obtain the structure of FIG. 2P, after which the seed layer 220 may be etched, as noted above. Note that etching of the seed layer is selected to be compatible with, that is, not damage, magnetic material layer 115 being exposed. The resultant structure is depicted in FIG. 2Q.

As illustrated in FIG. 2R, a further uncured, polymer-dielectric material layer, referred to herein as an upper polymer-dielectric material layer 105', may be provided over the structure so as to surround and at least partially overlie the conductive vias portions 120 extending, for instance, from the lower conductive portions 110 of the structure. This upper polymer-dielectric material is, in one embodiment, the same material as employed about lower conductive portions 110. The upper polymer-dielectric material is partially cured via a soft bake or low-temperature anneal process such as described above, and then polished, for instance, via chemical-mechanical polishing process, to planarize the upper surface of the partially-cured, upper polymer-dielectric material 105'. The polishing also exposes the upper surfaces of the conductive vias portions 120, and if desired, planarizes the upper surfaces of the conductive vias at the same time.

After polishing, a final curing or heat treatment of the polymer-dielectric material may be performed in order to harden the material for further processing. The planarized upper surface of the structure depicted in FIG. 2S forms the base for the upper conductive portions of the circuit elements to be fabricated. By repeating the processes of FIGS. 2A-2F, the upper conductive portions 130 may be formed as illustrated in FIG. 2T. Upper conductive portions 130 may similarly include separate conductive channels, which with the lower conductive portions and the conductive vias portions are configured and positioned to electrically connect and define one or more coils of the circuit elements. One embodiment of this structure is illustrated in the example of FIGS. 1A-1C, described above. In the cross-sectional elevational view of FIG. 2T, the upper conductive portions 130 also extend outwards to define the conductive contacts that electrically connect to the desired conductive vias 120 in a particular coil configuration, such as the transformer configuration illustrated in FIGS. 1A-1C. Bond pads or contact pads 230 remain exposed after a further coating with and patterning of, for instance, the same polymer-dielectric material 105, along with a final curing of the patterned polymer-dielectric material over the structure, as shown in FIG. 2U. In one embodiment, standard photo processing may be used to define the bond pads or contact pads, with the resultant inductor or transformer coils shown fully encased within the polymer dielectric material in FIG. 2U.

As illustrated in FIG. 2V, the substrate or wafer may be diced, producing the desired circuit elements 100' as discrete die. Standard blade dicing may be employed at this processing stage. Depending upon the die size, the wafer may first be divided into, for instance, quarter-wafers for processing.

FIG. 2W depicts one embodiment of a final package structure, with the overlying protective polymer-dielectric material not shown. The particular coil configuration of upper conductive portion 130 is illustrated by way of example only. Further, the bond pad connections 111, 131 to the coils are by way of example only. In this embodiment, bond pad connections 111 are assumed to connect to respective conductive vias (not shown) of the conductive vias portion of the circuit element. This bond pad footprint may follow a standard quad-flat-no-lead (QFN) outline, such as either four or six-pin. If six-pin is used, the center pads 140 may be provided for extra mechanical integrity for surface mounting, that is, there could be no electrical connection to center pads 140 in such a design.

Figure 3:
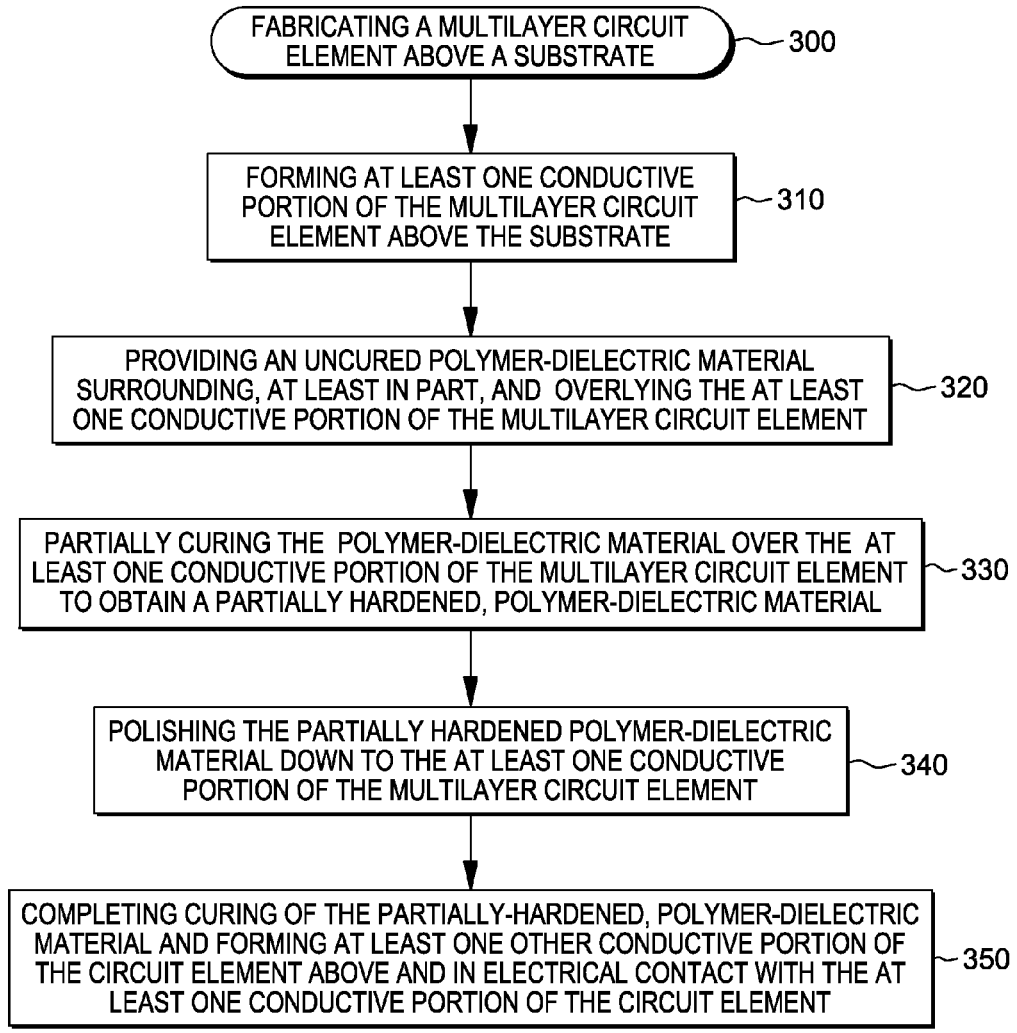
FIG. 3 depicts an overview of processing which may be employed in wafer-level, bulk fabrication of multilayer circuit elements, in accordance with one or more aspects of the present invention.

Those skilled in the art will note that disclosed herein are processes for fabricating a multilayer circuit element, such as a multilayer inductor or transformer fabricated over a substrate. Wafer-level bulk processing may be employed to simultaneously create a large number of similar circuit elements. Referring to FIG. 3, the fabrication process 300 includes, for instance: forming at least one conductive portion of the multilayer circuit element above the substrate 310; providing an uncured polymer-dielectric material surrounding, at least in part, and overlying the at least one conductive portion of the multilayer circuit element 320; partially curing the polymer-dielectric material over the at least one conductive portion of the multilayer circuit element to obtain a partially hardened polymer-dielectric material 330; polishing the partially hardened, polymer-dielectric material down to the at least one conductive portion of the multilayer circuit element 340; and completing curing of the partially hardened, polymer-dielectric material and forming at least one other conductive portion of the circuit element above and in electrical contact with the at least one conductive portion of the circuit element 350.

In one implementation, subsequent to the polishing, the process includes completing curing of the polymer-dielectric material to obtain a hardened polymer dielectric material. The hardened dielectric material surrounds, at least in part, the at least one conductive portion of the circuit element, and has an upper surface coplanar with an upper surface of the at least one conductive portion of the circuit element. The process may further include depositing a dielectric material layer over the hardened polymer-dielectric material, and providing and patterning a magnetic material layer over the dielectric material layer and above the at least one conductive portion of the circuit element prior to forming the at least one other conductive portion of the circuit element. This process is particularly advantageous where the circuit element is an inductive circuit element, including for instance, an inductor or a transformer.

In one embodiment, the at least one conductive portion includes a lower conductive portion of the circuit element, and the polishing further planarizes an upper surface of the lower conductive portion. The at least one other conductive portion of the circuit element may include a conductive vias portion of the circuit element in physical contact with the lower conductive portion. In one implementation, forming the conductive vias portion of the circuit element may include, at least in part, forming the conductive vias portion by selectively electroplating within respective mask via openings above the lower conductive portion of the circuit element.

In a further implementation, subsequent to forming the conductive vias portion of the circuit element, another layer of the uncured polymer-dielectric material may be provided surrounding, at least in part, and overlying the conductive vias portion of the circuit element. Afterwards, the another layer of uncured polymer-dielectric material may be partially cured to obtain a partially hardened, upper polymer-dielectric material. The process may further include polishing the partially hardened, upper polymer-dielectric material down to the conductive vias portion of the circuit element, where polishing of the partially hardened, upper polymer-dielectric material includes planarizing the upper polymer-dielectric material and exposing upper surfaces of the conductive vias portion of the circuit element to facilitate forming the circuit element. By way of example, an upper conductive portion of the circuit element may be provided above and in electrical contact with the conductive vias portion. In one implementation, the lower conductive portion of the circuit element includes a lower conductive coil portion of the circuit element, and the upper conductive portion of the circuit element includes an upper conductive coil portion of the circuit element, and the lower conductive coil portion, the conductive vias portion, and the upper conductive coil portion of the circuit element form, at least in part, one or more coils. In one embodiment, a magnetic material layer may be disposed above the lower conductive coil portion and the coil(s) may extend around the magnetic material layer.

In one embodiment, the polishing may include chemical mechanical polishing of the partially hardened, polymer-dielectric material to planarize an upper surface thereof, and to planarize an exposed upper surface of the at least one conductive portion of the circuit element. Partially curing the uncured polymer-dielectric material may include soft baking or low temperature annealing the uncured polymer-dielectric material to obtain the partially hardened, polymer-dielectric material. Advantageously, forming the circuit element may include forming the circuit element with a desired outline, such as a Quad-Flat-No-Lead (QFN) outline.

Those skilled in the art will note that provided herein is a unique wafer level solution to fabricating a plurality of discrete circuit elements or die. Advantageously, a polymer-dielectric material and polymer polishing process are employed to allow for full planarization of relatively thick films and successful build up of subsequent layers of the circuit element, as well as to meet specified dimensional requirements. The processes presented herein facilitate highly scalable solutions depending on the overall circuit element requirements, such as inductive requirements of an inductor or transformer. A magnetic material layer or strip may be incorporated within the circuit element to enhance inductance of the one or more coils of the circuit element. Wafer level processing allows for batch fabrication of the discrete circuit elements on a large scale, translating into lower fabrication cost. A JEDEC standard footprint may be achieved for, for instance, surface mount compatibility to facilitate higher level two dimensional or three dimensional integration of the circuit element into higher level packaging.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   forming a circuit element above a substrate, the forming comprising:
   forming, in at least one layer above the substrate, at least one conductive portion of the circuit element;
   providing an uncured polymer-dielectric material surrounding, at least in part, and overlying the at least one conductive portion of the circuit element;
   partially curing the polymer-dielectric material to obtain a partially-hardened, polymer-dielectric material;
   polishing the partially-hardened, polymer-dielectric material down to the at least one conductive portion of the circuit element; and
   forming at least one other conductive portion of the circuit element above and in electrical contact with the at least one conductive portion of the circuit element, the at least one other conductive portion of the circuit element comprising a conductive vias portion of the circuit element in contact with the lower conductive portion; and
   subsequent to forming the conductive vias portion of the circuit element, providing another layer of the uncured polymer-dielectric material surrounding, at least in part, and overlying the conductive vias portion of the circuit element, partially hardening the another layer of uncured polymer-dielectric material over the conductive vias portion of the circuit element to obtain a partially-hardened, upper polymer-dielectric material.

2. The method of claim 1, further comprising, subsequent to the polishing, completing curing of the polymer-dielectric material to obtain a hardened polymer-dielectric material, the hardened polymer-dielectric material surrounding, at least in part, the at least one conductive portion of the circuit element, and having an upper surface coplanar with an upper surface of the at least one conductive portion of the circuit element.

3. The method of claim 2, further comprising depositing a dielectric material layer over the hardened polymer-dielectric material, and providing and patterning a magnetic material layer over the dielectric material layer and above the at least one conductive portion of the circuit element prior to forming the at least one other conductive portion of the circuit element.

4. The method of claim 1, wherein the at least one conductive portion comprises a lower conductive portion of the circuit element, and wherein the polishing further planarizes an upper surface of the lower conductive portion.

5. The method of claim 4, wherein the at least one other conductive portion of the circuit element comprises a conductive vias portion of the circuit element in contact with the lower conductive portion.

6. The method of claim 5, wherein the circuit element comprises one of a multilayer inductor or a multilayer transformer, and the method further comprises providing a magnetic material layer above the lower conductive portion of the circuit element, the magnetic material layer residing, at least partially, within a region defined by the conductive vias portion of the circuit element.

7. The method of claim 5, wherein forming the conductive vias portion of the circuit element comprises, at least in part, forming the conductive vias portion by electroplating above the lower conductive portion of the circuit element.

8. The method of claim 5, further comprising polishing the partially-hardened, upper polymer-dielectric material down to the conductive vias portion of the circuit element, the polishing of the partially-hardened, upper polymer-dielectric material planarizing the partially-hardened, upper polymer-dielectric material and exposing upper surfaces of the conductive vias portion of the circuit element to facilitate the forming of the circuit element.

9. The method of claim 8, further comprising providing an upper conductive portion of the circuit element above and in electrical contact with the conductive vias portion of the circuit element.

10. The method of claim 9, wherein the lower conductive portion of the circuit element comprises a lower conductive coil portion of the circuit element, and the upper conductive portion of the circuit element comprises an upper conductive coil portion of the circuit element, and wherein the lower conductive coil portion, the conductive vias portion, and the upper conductive coil portion of the circuit element form, at least in part, at least one coil which extends around a magnetic material layer above the lower conductive coil portion of the circuit element.

11. The method of claim 1, wherein the at least one conductive portion comprises a lower conductive portion of the circuit element, and the forming thereof comprises:

depositing a dielectric material layer over the substrate;
providing a seed layer deposition over the dielectric material layer to facilitate electroplating;
coating a photoresist material over the seed layer and patterning the photoresist material to define multiple channels therein;
electroplating within the multiple channels to define a lower conductive coil portion of the circuit element; and
removing the photoresist material and etching the seed layer.

12. The method of claim 1, wherein the at least one conductive portion comprises a lower conductive portion, and a conductive vias portion of the circuit element disposed over and in electrical contact with the lower conductive portion thereof, and wherein the uncured polymer-dielectric material surrounds, at least partially, and overlies the conductive vias portion of the circuit element, and wherein the polishing planarizes the partially-hardened, polymer-dielectric material and exposes an upper surface of the conductive vias portion of the circuit element to facilitate the forming of the at least one other conductive portion of the circuit element in electrical contact therewith.

13. The method of claim 12, wherein the at least one other conductive portion comprises an upper conductive portion of the circuit element disposed over and in electrical contact with the conductive vias portion of the circuit element.

14. The method of claim 13, wherein the circuit element comprises one of an inductor or a transformer, and the lower conductive portion, the conductive vias portion, and the upper conductive portion together define at least one coil of the circuit element.

15. The method of claim 14, further comprising providing at least one magnetic material layer disposed, at least partially, within a region defined by the at least one coil of the circuit element.

16. The method of claim 1, wherein the polishing comprises chemical-mechanical polishing the partially-hardened, polymer-dielectric material to planarize an upper surface thereof, and to planarize an exposed upper surface of the at least one conductive portion of the circuit element.

17. The method of claim 1, wherein the partially curing comprises annealing the uncured polymer-dielectric material to obtained the partially-hardened, polymer-dielectric material, and wherein the polishing comprises chemical-mechanical polishing the partially-hardened, polymer-dielectric material.

18. The method of claim 1, wherein the substrate comprises a semiconductor wafer.

19. The method of claim 1, wherein the circuit element is one of a multilayer inductor or a multilayer transformer.

20. The method of claim 19, wherein forming circuit element comprises forming the circuit element with a quad-flat-no-lead (QFN) outline, and dicing the substrate to separate the circuit element.

* * * * *